United States Patent [19]

Held

[11] Patent Number: 4,469,625

[45] Date of Patent: Sep. 4, 1984

[54] PROLONGED TACK TONERS FOR THE PREPARATION OF ELECTRIC CIRCUITS

[75] Inventor: Robert P. Held, Englishtown, N.J.

[73] Assignee: E. I. Du Pont de Nemours and Company, Wilmington, Del.

[21] Appl. No.: 124,606

[22] Filed: Feb. 25, 1980

[51] Int. Cl.³ .............................................. H01B 1/02
[52] U.S. Cl. .................................. 252/514; 252/512; 252/518; 524/522; 524/439; 524/570
[58] Field of Search ............... 252/511, 512, 514, 500, 252/518, 519, 520; 106/1.13, 1.14, 1.15, 1.18, 1.19, 1.21; 524/439, 522, 401, 570, 440

[56] References Cited

U.S. PATENT DOCUMENTS

| | | | |
|---|---|---|---|
| 2,608,542 | 8/1952 | Smith et al. | 260/27 |
| 3,060,024 | 10/1962 | Burg et al. | 96/28 |
| 3,746,568 | 7/1973 | Rybarczyk | 252/514 |
| 3,762,944 | 10/1973 | Sloan et al. | 96/1 |
| 3,830,651 | 8/1974 | Minneman et al. | 252/514 |
| 4,127,699 | 11/1978 | Becker et al. | 252/511 |
| 4,220,698 | 9/1980 | Brynko | 252/511 |
| 4,242,434 | 12/1980 | Hirakura et al. | 252/500 |
| 4,303,698 | 12/1981 | Beske et al. | 427/96 |
| 4,654,174 | 10/1977 | Mastrangelo | 252/514 |

Primary Examiner—Josephine Barr

[57] ABSTRACT

Prolonged tack toner consisting essentially of organic polymer, plasticizer therefor, electrically conductive metal particles, glass frit, and, optionally, inorganic particulate refractory materials, the plasticizer being present in an amount greater than its compatibility level in the polymer. The toner is useful for preparing electrically conductive images or circuits.

6 Claims, No Drawings

PROLONGED TACK TONERS FOR THE PREPARATION OF ELECTRIC CIRCUITS

DESCRIPTION

1. Technical Field

This invention relates to prolonged tack toners. More particularly the invention relates to prolonged tack toners containing conductive metal particles and glass frit.

2. Background Art

The preparation of electrically conductive images or circuits on inert substrates using compositions comprising carriers or vehicles, conductive metal particles and glass frit is known. The carrier or vehicle can be polymerizable or nonpolymerizable to actinic radiation. Generally these compositions are placed on the inert substrate by printing techniques such as screen printing. After firing the image on the inert substrate a useful electrically conductive circuit is obtained. Screen printing has limited resolution capabilities.

It is desirable to prepare electrically conductive circuits on inert substrates by an additive method wherein a high resolution image of the circuit can be formed directly without need for developing the image. To form such a circuit a need existed for a new type of toner which is capable of depositing on a substrate sufficient glass and conductive metal to provide a high quality fused conductive circuit.

DISCLOSURE OF THE INVENTION

In accordance with this invention there is provided a prolonged tack toner consisting essentially of an organic polymer, a solid plasticizer for the polymer, electrically conductive metal particles, glass frit, and optionally finely divided inorganic particulate nonglass forming materials, the plasticizer being present in an amount greater than its compatibility level in the polymer.

The term "prolonged tack toners" means toners that are nontacky at normal room temperatures but upon heating to an elevated temperature become and remain tacky for a period of time even though the temperature of the toner returns or is returned to a temperature below the temperature at which the toner becomes tacky, including room temperature. Such toners are sometimes referred to as delayed tack toners. The prolonged tack toners of this invention consist essentially of (1) an organic polymer such as a thermoplastic resin, (2) a plasticizer or heat activatable tackifying agent solid at room temperature present in an amount greater than its compatibility level in the polymer, (3) electrically conductive metal particles, (4) glass frit, and, optionally, (5) finely divided inorganic particulate nonglass forming materials which are refractory.

Examples of combination of organic polymer (1) and plasticizer (2) include: polystyrene and N-cyclohexyl-p-toluenesulfonamide, poly(methylmethacrylate(90)/methacrylic acid(10)) and triphenyl phosphate, styrene/maleic anhydride copolymer and triethylene glycol dibenzoate, etc. In the combination of poly(methylmethacrylate/methacrylic acid) and triphenyl phosphate plasticizer the latter component is present in an amount greater than 48% by weight based on the weight of polymer and plasticizer.

The electrically conductive metal particles (3) are taken from the group consisting of silver, gold, platinum, copper, palladium and combinations thereof. The particle size range is about 0.3 to 10 microns (majority 1 to 5 microns) with the particles being spherical, random or flake in shape. The metal particles are present in an amount of about 86 to 98% by weight based on the weight of the metal particles (3), glass frit (4) and any inorganic particulate material (5) present.

The glass frit has a softening point range of 325°–600° C. Preferred glass frits include the lead boro-silicate-type glasses; an especially preferred composition is (mole %): PbO(53.1), $B_2O_3$(2.9), $SiO_2$(29.0), $TiO_2$(3.0), $ZrO_2$(3.0), ZnO (2.0), $Na_2O$ (3.0), and CdO (4.0). The glasses can be prepared by conventional glass-making techniques, by mixing the desired components (or precursors thereof, e.g., $H_3BO_3$ for $B_2O_3$) in the desired proportions and heating the mixture to form a melt. Heating is conducted to a peak temperature and for a time such that the melt becomes entirely liquid, yet gaseous evolution has ceased. The peak temperature is in the range of 1100°–1500° C., usually 1200°–1400° C. The melt is then fritted by cooling the melt, e.g., by pouring onto a cold belt or into cold running water. Particle size reductions can be accomplished by milling. The glass frit is present in an amount of about 1.3 to 10.3% by weight based on the weight of metal particles (3), glass frit (4) and any inorganic particulate material (5) present.

Finely divided inorganic particulate nonglass forming materials which are refractory can optionally be present in the prolonged track toner. Useful materials include: aluminum oxide, copper oxide, cadmium oxide, gadolinium oxide, zirconium oxide cobalt/iron/chromium oxide, etc. The oxides or their oxide precursors have a particle size range of 0.5 to 44.0 micrometers, with at least 80% by weight of the particles in the 0.1 to 5.0 micrometer range. The inorganic particulate refractory material can be present in amounts up to 45.0% by weight based on the weight of the glass frit (4) and the inorganic particulate refractory material (5) preferably about 25.0% by weight.

The prolonged tack toners of this invention can be made by physical mixing, melt suspension technique and other methods known to those skilled in the art.

In preparing an electrically conductive image or circuit on an inert subtrates, e.g., glass plate or sheet, e.g., float glass; ceramic, porcelain on steel, a toner-receptive image is generated thereon. Float glass is plate glass made by floating the glass while cooling on a bed of molten tin to provide a smooth surface adequate for the preparation of metallic conductive circuits. The toner-receptive image may be formed on the inert substrate directly, e.g., by applying a tacky material onto the inert substrate in an imagewise manner or by applying a layer of tacky photosensitive composition to the inert substrate and imagewise exposing the layer whereby only the unexposed areas remain tacky and toner-receptive. The toner-receptive image may also be formed on the inert substrate by laminating as described in U.S. Pat. No. 4,174,216 a negative peel apart photosensitive element to the substrate, imagewise exposing the photosensitive element, stripping the cover sheet and toning the toner-receptive tacky areas.

Alternatively, a latent toner receptive image can be formed on a master substrate, e.g., polymeric film, plastic, metal or sheet such as paper, whereon it adheres, and, after applying prolonged tack toner, which is then activated, the toned image can be transferred to an inert substrate. "Latent toner receptive image on the substrate master", as used in this specification, means any image capable of being developed through the application of toner particles, including, but not limited to, electrostatic images, electromagnetic images, or images comprising tacky areas and nontacky background areas. The tacky images can be formed directly, e.g., by exposure to actinic radiation, or by treatment with solutions, heat, or other means. Preferably the tacky images are formed in photosensitive layers which may be comprised of positive-working or negative-working compositions.

After the latent toner receptive image is formed on the master substrate a prolonged tack toner is applied to produce a nontacky toned image. Generally, this toner contains organic polymer and plasticizer solid at room temperature without the metal particles and glass frit. The toned image is heated to a temperature sufficient to activate the toner by rendering the toner tacky. The master substrate with its toned tacky image is then brought into intimate contact with an inert substrate, and while the toner is still activated, the master substrate and inert substrate are separated. A portion of the activated prolonged tack toner transfers imagewise from the master substrate to the inert substrate.

In order to form a duplicate image on another inert substrate, the temperature of the tackified toned master substrate is reduced (or permitted to be reduced) below the activating temperature of the prolonged tack toner wherein the toner remains tacky and prolonged tack toner is again applied over the remaining prolonged tack toner on the master substrate and the steps of heating the toner, contacting the toner with the new inert substrate and separating the surfaces are repeated. Each repetition of the process requires a new inert substrate. It is also possible to build up the toned image on an inert substrate by repeating the process as described above. A process for image development of a latent image on a master substrate and transferring the toned image to another substrate is described in U.S. application Ser. No. 124,605, filed Feb. 25, 1980 entitled "Multiple Transfer of Tacky Image Areas Using Prolonged Tack Toners".

After the prolonged tack toner image is obtained on the inert substrate, the toned image areas are activated by heating, and the temperature is reduced below the activating temperature, wherein the activated prolonged tack toner remains tacky. A prolonged tack toner comprising organic polymer, plasticizer, conductive metal particles and glass frit, as described above, is then applied to the tackified toned image. Additional amounts of the particulate metal containing toner can be applied to the image as described. It has been found desirable to apply as a final toner, a prolonged tack toner containing greater amounts of metal particles.

The organic polymer and plasticizer components of the prolonged tack toner are burned off by increasing the temperature of the inert substrate and toned image. Subsequently, the inert substrate and toned image are fired to a temperature sufficient to fuse the glass frit and sinter the metal particles. The burning and firing temperatures used are dependent on the materials present in the toned image. A temperature range found useful for burning is 320° to 450° C. A firing temperature range is 540° to 950° C. The inert substrates described above are not affected by the elevated temperatures or the manner in which the image is generated thereon. The process for preparation of an electrically conductive image on an inert substrate is described in U.S. application Ser. No. 124,607, filed Feb. 25, 1980 entitled "Use of Prolonged Tack Toners For the Preparation of Electric Circuits" now U.S. Pat. No. 4,303,698.

BEST MODE FOR CARRYING OUT THE INVENTION

The best mode is illustrated in Example 5.

INDUSTRIAL APPLICABILITY

The prolonged tack toners are useful for the preparation of electrically conductive images or circuits on inert substrates, e.g., AC plasma display electrodes for computer video display output.

EXAMPLES

The following examples illustrate the invention wherein the parts and percentages are by weight. In Examples 1 and 2, the prolonged tack toners are prepared by physical mixing. In Examples 3 to 7, the prolonged tack toners are prepared by a melt suspension process as follows: triphenyl phosphate is melted in a beaker and the poly(methylmethacrylate/methacrylic acid) is added with mixing until it dissolves. Metal powder and glass frit are stirred into the mixture to prepare a uniform suspension. The suspension is cooled by immersing in dry ice including pouring some dry ice over the suspension. After cooling, the hardened suspension is chipped out of the beaker and is ground to a particle size of about 50 to 250 microns using a standard size reduction machine as an Osterizer ®. Care is taken at this stage not to generate heat sufficient to melt the toner. In practice, size reduction is accomplished by actuating the machine for short periods of time, e.g., 3 to 5 seconds and not more than 10 seconds. Following size reduction, the particles are wet ball milled for about 45 minutes in the presence of water using a vertical ball mill comprising a metal beaker, Dragonite ® glass beads and a stirring rod turning at about 200 rpm. The particles at this point are in the range of 5 to 10 microns average size. The milled toner is filtered and dried, preferably in a low humidity environment. Prior to use the toner is ground to break up any agglomerates present.

EXAMPLE 1

A prolonged tack toner is prepared by mixing in a suitable mixer the following components in the amounts indicated:

| Component | Amount (g) |
|---|---|
| Polystyrene, high molecular weight | 2.9 |
| N—cyclohexyl-p-toluenesulfonamide | 5.7 |
| Silver powder, particle size distribution 0.3–10.0μ | 7.4 |
| Glass frit | 1.2 |

A tacky solution of the following composition is prepared:

| Component | Amount (g) |
|---|---|
| Triethylene glycol diacetate | 1.2 |
| Polymethylmethacrylate | 0.8 |
| Methylene chloride | 18.0 |

Using the tacky solution, lines are painted on a clean, dry glass substrate at room temperature. The solvent is allowed to evaporate leaving a tacky clear image. The tacky image is toned with the above-described prolonged tack toner. The toned image is heated above the temperature sufficient to melt the prolonged tack toner, the temperature is permitted to return to room temperature, and the toned image is retoned with the same toner. The retoned image is burned at about 425° C. for about one hour and then fired at a temperature of about 615° C. for about one hour. The resistivity measurements on the electrically conductive lines are measured as 0.0025 ohm/square.

EXAMPLE 2

The procedure of Example 1 is repeated except that the prolonged tack toner is of the following composition:

| Component | Amount (g) |
| --- | --- |
| Styrene/maleic anhydride copolymer, average molecular weight 10,000 | 2.9 |
| Triethylene glycol dibenzoate | 5.7 |
| Silver powder, particle size distribution 0.3–10.0μ | 7.4 |
| Glass frit | 1.2 |

The resistivity measurements on the electrically conductive lines are measured as 0.0025 ohm/square.

EXAMPLES 3 TO 7

The following prolonged tack toners having the composition set forth in the Table are prepared by the melt suspension procedure described above.

TABLE

| Ex. | Polymer | Plasticizer | Metallic Powder | Glass Frit |
| --- | --- | --- | --- | --- |
| 3. | Poly(methyl-methacrylate (90)/-methacrylic acid(10)) 2.1 g | Triphenyl phosphate 6.3 g | Silver, 0.3–10 10.8 g | 0.78 g* |
| 4. | As described in Ex. 3 3.38 g | As described in Ex. 3 6.62 g | As described in Ex. 3 9.38 g | 0.38 g** |
| 5. | As described in Ex. 3 3.38 g | As described in Ex. 3 6.62 g | As described in Ex. 3 18.60 g | 1.38 g*** |
| 6. | As described in Ex. 3 1.64 g | As described in Ex. 3 3.33 g | Gold, 1.0 4.83 g | 0.17 g |
| 7. | As described in Ex. 3 (a) 3.38 g (b) 1.26 g | As described in Ex. 3 (a) 6.62 g (b) 3.74 g | Copper, <1.0 μ (a) 9.0 g (b) 14.1 g | (a) 1.0 g (b) 0.9 g |

*Contains inorganic refractory additives
**Includes 0.24 g inorganic refractory additives
***Includes Al$_2$O$_3$ inorganic refractory additive The Example 3 prolonged tack toner is applied to a 0.0004 inch (0.01 mm) thick photohardenable layer supported by a polyethylene terephthalate support coated with a resin sublayer. The photohardenable layer is of the following composition:

| Component | Parts |
| --- | --- |
| Poly(methylmethacrylate) high molecular weight | 19.30 |
| Poly(vinyl acetate) high molecular weight | 19.30 |
| Trimethylolpropane trimethacrylate | 40.60 |
| Polyoxyethylated trimethylolpropane triacrylate | 9.10 |
| Polyethylene glycol [4] lauryl ether | 9.10 |
| 2-o-Chlorophenylbisphenyl-imidazolyl dimer | 1.60 |
| 2,2′-Dihydroxy-4-methoxy-benzophenone | 0.08 |
| 2-(Stilbyl-4″)-(naphtho′,2′,4,5)-1,2,3-triazole-2″-sulfonic acid phenylester | 0.20 |
| 2-Mercaptobenzothiazole | 0.80 |

After imagewise exposure for 40 seconds in a vacuum frame to a 2 KW standup Addalux® light source equipped with a "photopolymer bulb", the exposed surface of the photohardened layer is toned by hand with a pad using a prolonged tack toner containing triphenyl phosphate 14.0 g and poly(methylmethacrylate(90)/methacrylic acid(10)) 6.0 g. The toned layer is heated to about 60° C., the temperature is reduced to below 60° C. with the toner remaining tacky, and additional prolonged tack toner described above is applied. The retoned image is heated to 60° C. to tackify the toner. A float glass substrate preheated to 75° to 85° C. is brought into contact with the tacky image and upon separation the tacky toned image transfers to the glass substrate. The transferred image is toned eight times with the prolonged tack toner described in the Table by heating, cooling and toning. The toned image is heated to 320° C., held for one hour, is heated to 450° C., held for one hour and is then fired at 615° C. for one hour. After cooling slowly the resistivity measurements on the electrically conductive lines are measured as 0.034 ohm/square.

In Example 4 a prolonged tack toner of the following composition is coated on an imaged photohardenable element as described in Example 3.

| Component | Amount (g) |
| --- | --- |
| Triphenyl phosphate | 15.0 |
| Poly(methylmethacrylate(90)/-methacrylic acid(10)) | 5.0 |
| CI 109 red dye | 0.2 |

The toned image is transferred to a float glass substrate at 75° to 85° C. using pressure rolls. The transferred image is toned six times with the toner described in the above Table, followed by two times with the toner set forth below that does not exhibit prolonged tack properties using the same process of toning, heating to activate, cooling and retoning as described in Example 3.

| Component | Amount (g) |
| --- | --- |
| Silver particles, 0.3–10.0μ | 16.8 |
| Glass frit | 0.7 |
| Inorganic refractory additives | 0.4 |
| Triphenyl phosphate | 1.4 |
| Poly(methylmethacrylate(90)/-methacrylic acid(10)) | 0.7 |

The eight-times toned element is then heated, fired and cooled following the procedure described in Example 3. The measured resistivity is 0.112 to 0.130 ohm/square.

In Example 5, a prolonged tack toner described in the Table above is applied to the surface of an imaged photohardenable element as described in Example 3. The toned image is heated to 60° C. for thirty seconds to melt the toner which is then transferred to a glass substrate preheated to 85° C. by the procedure described in Example 3. The transferred image is retoned twice with the toner described in the above Table using the procedure described in Example 3. The toned surface is then retoned once using the following nonprolonged tack toner.

| Component | Amount (g) |
| --- | --- |
| Silver powder, spherical particles 1–5μ | 15.3 |
| Glass frit and Al₂O₃ | 2.6 |
| Triphenyl phosphate | 1.4 |
| Poly(methylmethacrylate(90)/-methacrylic acid(10)) | 0.7 |

The toned image is heated in an oven at about 320° C. for one half hour and is heated at 420° C. for another half hour. The toned image is then fired in an oven at about 615° C. to fuse the glass frit and sinter the silver powder, followed by cooling. The electrically conductive image formed has a resistivity of 0.14 ohm/square.

In Example 6, a prolonged tack toner described in the Table above is applied twice to the surface of an imaged photohardenable element as described in Example 3. Following toning the image is transferred to the clean surface of a substrate of porcelain on steel backing which is preheated under infrared radiation to about 88° C. The transferred image is toned three times by the procedure described in Example 3 again using the prolonged tack toner described in the Table above. A final nonprolonged tack toner of the following composition is applied:

| Components | Amount (g) |
| --- | --- |
| Gold particles, less than 1μ size | 9.04 |
| Glass frit | 0.32 |
| Triphenyl phosphate | 0.43 |
| Poly(methylmethacrylate(90)/-methacrylic acid(10)) | 0.21 |

Using the procedure of Example 3, the cycle is repeated three more times to provide a total of twelve layers. The toned element is heated and fired as described in Example 3. After cooling, the resistivity is measured as 0.001 to 0.002 ohm/square.

In Example 7, a flat ceramic substrate comprising porous alumina is cleaned and prepared by dipping in a 1% solution of poly(methylmethacrylate(90)/methacrylic acid(10)) in acetone. An image is formed on the surface of a photohardenable element as described in Example 3, the image being toned twice with the following toner:

| Component | Amount (g) |
| --- | --- |
| Triphenyl phosphate | 15.0 |
| Poly(methylmethacrylate(90)/-methacrylic acid(10)) | 5.0 |
| CI 109 red dye | 0.2 |

Using the procedure described in Example 6, the image is transferred to the ceramic substrate and is toned once more with the above toner. The toned, transferred image is then toned as described in Example 6 three times with prolonged tack toner (a) of the above Table followed by one application of prolonged tack toner (b) of the above Table for a total of four separate cycles, i.e., the total toned layers is fifteen. The toned element is fired for one hour in a nitrogen belt type furnace set to reach a peak temperature of 900° C. After cooling, the resistivity is measured as 0.004 to 0.008 ohm/square.

I claim:

1. A particulate prolonged tack toner consisting essentially of an organic thermoplastic polymer, a solid plasticizer for the polymer, electrically conductive metal particles, glass frit, and, optionally finely divided inorganic particulate nonglass forming refractory materials, the plasticizer component being present in an amount greater than its compatibility level in the polymer and the metal particles, glass frit and inorganic particulate nonglass forming refractory material being present in amounts of 86 to 98% by weight, 1.3 to 10.3% by weight and 0 to 45% by weight, respectively, the weight percentages of the metal particles and glass frit based on the weight of metal particles, glass frit and any inorganic particulate refractory material present, and the weight percentage of inorganic particulate refractory material based on the weight of glass frit and inorganic particulate refractory material.

2. A particulate prolonged tack toner consisting essentially of an organic thermoplastic polymer, a solid plasticizer for the polymer, electrically conductive metal particles selected from the group consisting of silver, gold, platinum, palladium, copper and combinations thereof, glass frit, and optionally finely divided inorganic particulate nonglass forming refractory materials, the plasticizer component being present in an amount greater than its compatibility level in the polymer, the metal particles, glass frit and inorganic particulate nonglass forming refractory material being present in amounts of 86 to 98% by weight, 1.3 to 10.3% by weight and 0 to 45% by weight, respectively, the weight percentages of the metal particles and glass frit based on the weight of metal particles, glass frit and any inorganic particulate refractory material present, and the weight percentage of inorganic particulate refractory material based on the weight of glass frit and inorganic particulate refractory material.

3. A prolonged tack toner according to claim 1 or 2 wherein the polymer and plasticizer components of the prolonged tack toner are polystyrene and a toluenesulfonamide compound, respectively.

4. A prolonged tack toner according to claim 1 or 2 wherein the polymer and plasticizer components of the prolonged tack toner are poly(methylmethacrylate/methacrylic acid) and triphenyl phosphate, respectively, the plasticizer component being present in an amount greater than 48 percent by weight based on the weight of the polymer and plasticizer components.

5. A prolonged tack toner according to claim 1 wherein the metal particles range in particle size from 0.3 to 10 microns.

6. A prolonged tack toner according to claim 1 wherein the metal particles are flaked silver.

* * * * *